United States Patent [19]

Maeda et al.

[11] Patent Number: 5,051,380

[45] Date of Patent: Sep. 24, 1991

[54] PROCESS FOR PRODUCING SEMICONDUCTOR DEVICE

[75] Inventors: Kazuo Maeda; Noboru Tokumasu; Yuko Nishimoto, all of Tokyo, Japan

[73] Assignees: Semiconductor Process Laboratory Co., Ltd.; Alcan-Tech Co., Inc., both of Tokyo, Japan

[21] Appl. No.: 628,510

[22] Filed: Dec. 14, 1990

[30] Foreign Application Priority Data

Dec. 27, 1989 [JP] Japan .................. 1-339073

[51] Int. Cl.⁵ .................................... H01L 21/02
[52] U.S. Cl. .................................... 437/238; 437/235; 148/DIG. 118; 427/248.1; 427/255.3
[58] Field of Search ................. 437/238, 235; 148/DIG. 118; 427/248.1, 255.3

[56] References Cited

U.S. PATENT DOCUMENTS 3,055,776  9/1962  Stevenson ................ 437/238
4,845,054  7/1989  Mitchener ............... 437/238
4,872,947 10/1989  Wang et al. ........... 427/248.1

OTHER PUBLICATIONS

Kotani et al., "Low Temperature APCVD Oxide Using TEOS-Ozone Chemistry for Multilevel Interconnections" IEDM, Dec. 3-6, 1989, pp. 669-671 IEEE, Washington, D.C.

Primary Examiner—Brian E. Hearn
Assistant Examiner—Trung Dang
Attorney, Agent, or Firm—Sprung Horn Kramer & Woods

[57] ABSTRACT

In a process for producing a semiconductor device, deposition of a CVD-SiO$_2$ film at a given first O$_3$ concentration according to a TEOS-SiO$_3$ reaction is followed by further deposition of a CVD-SiO$_2$ film at a second O$_3$ concentration higher than the first O$_3$ concentration according to the TEOS-O$_3$ reaction to form a CVD-SiO$_2$ film having a predetermined thickness and a surface little uneven.

2 Claims, 4 Drawing Sheets

PROCESS FOR PRODUCING SEMICONDUCTOR DEVICE

BACKGROUND OF THE INVENTION

1. Field of the Invention

The present invention relates to a process for producing a semiconductor device, and more particularly to a process for depositing a CVD-SiO$_2$ film according to a TEOS-O$_3$ reaction.

2. Prior Art

FIG. 4 is an illustration of a conventional process for depositing a CVD-SiO$_2$ film according to a TEOS (tetraethyl ortho-silicate, Si(OC$_2$H$_5$)$_4$, an alkoxysilane)-O$_3$ reaction.

FIG. 4 (a) illustrates a polycrystalline silicon film 6 (hereinafter referred to in brief as a "poly-Si film") formed on a thermal SiO$_2$ film 4 formed in a surface portion of an Si substrate 2 through a heat treatment thereof. Examples of semiconductor devices including such a structure includes a MOS transistor comprising a gate SiO$_2$ film coresponding to the thermal SiO$_2$ film 4 and a gate electrode corresponding to the poly-Si film 6.

On the structure of FIG. 4 (a), a CVD-SiO$_2$ film 8 is formed as an interlayer insulating film according to the TEOS-O$_3$ reaction as shown in FIG. 4 (b).

It has been found out that the surface of the CVD-SiO$_2$ film 8 in perspective view of FIG. 4 (c), deposited according to the TEOS-O$_3$ reaction, is even, or smooth, in the areas where the underlying surface is of the poly-Si film 6 (see a partially enlarged view A), but often uneven, or rough, in the areas where the underlying surface is of the thermal SiO$_2$ film 4 (see a partially enlarged view B).

The data of FIG. 3 obtained through experiment by the inventors of the present invention shows a tendency for the surface roughness of such a CVD-SiO$_2$ film to increase particularly with an increase in the O$_3$ concentration in the TEOS-O$_3$ reaction.

The uneven surface of the CVD-SiO$_2$ film 8 sometimes causes stress to be put on wirings formed thereon with high liability thereof to undergo disconnection and the like, leading to low reliability of a semiconductor device.

FIG. 3 is a characteristic diagram showing the relationship between the ozone concentration and the surface state of CVD-SiO$_2$ film, wherein the abscissa represents the ozone concentration (mol%) while the ordinate represents the surface roughness (Å), which was examined in the experiment by putting and running a probe on a CVD-SiO$_2$ film to measure a difference of altitude in the up-and-down movement of the probe.

The present invention has been made in view of the foregoing problems of the prior art. Accordingly, an object of the present invention is to provide a process for depositing a CVD-SiO$_2$ film according to a TEOS-O$_3$ reaction by which the unevenness of a CVD-SiO$_2$ film can be suppressed as much as possible.

SUMMARY OF THE INVENTION

In accordance with the present invention, there is provided a process for producing a semiconductor device, comprising depositing a CVD-SiO$_2$ film at a given first O$_3$ concentration according to a TEOS$_3$ reaction, and further depositing a CVD-SiO$_2$ film at a second O$_3$ concentration higher than the first O$_3$ concentration according to the TEOS-O$_3$ reaction.

The first O$_3$ concentration is preferably about 0.5 to 2 mol%, while the second O$_3$ concentration is preferably 4 to 7 mol%.

In the process of the present invention for producing a semiconductor device, the first O$_3$ concentration at the first stage of deposition of a CVD-SiO$_2$ film according to the TEOS-O$_3$ reaction is set as low as preferably about 0.5 to 2 mol%.

This makes the surface of the resulting CVD-SiO$_2$ film little uneven even on thermal SiO$_2$ film areas, if any, of an underlying surface as demonstrated by the characteristic diagram of FIG. 3 showing the relationship between the ozone concentration and the surface state of the CVD-SiO$_2$ film.

When the O$_3$ concentration is low, however, the film coverage around angular parts of stepped portions of the underlying surface, the moisture absorption characteristics of the film, etc. are insufficient. Accordingly, the film thickness is desired to be substantially irreducible minimum.

At the second stage, the second O$_3$ concentration is set as high as preferably about 4 to 7 mol% to further deposit a CVD-SiO$_2$ film according to the TEOS-O$_3$ reaction.

According to the foregoing procedure, the second-stage deposition at a high O$_3$ concentration undergo no substantial influences of the underlying thermal SiO$_2$ film areas, if any, to make the surface of the resulting CVD-SiO$_2$ film little uneven even on the thermal SiO$_2$ film areas of the underlying surface because the thermal SiO$_2$ film is covered with the CVD-SiO$_2$ film with a surface little uneven, deposited at the first stage.

At the second stage, the CVD-SiO$_2$ film is deposited at the high O$_3$ concentration to a predetermined thickness necessary for the process of the present invention. For example, when it is used as an interlayer insulating film, the CVD-SiO$_2$ film is deposited at the high O$_3$ concentration to a thickness suited for the interlayer insulating film.

The CVD-SiO$_2$ film formed at the high O$_3$ concentration is of high quality with low moisture absorption and with good coverage around angular parts of stepped portions of the underlying surface.

Thus, according to the process of the present invention, a highly reliable insulating film with a surface little uneven and good coverage all across the film can be obtained even if the underlying surface includes areas of a thermal SiO$_2$ film.

BRIEF DESCRIPTION OF THE DRAWINGS

The foregoing and other objects, features and advantages of the present invention will be better understood from the following description taken in connection with the accompanying drawings, in which.

DESCRIPTION OF PREFERRED EMBODIMENTS

The following Examples will now illustrate the present invention in more detail while referring to the accompanying drawings, but should not be construed as limiting the scope of the invention.

Figure 1A:
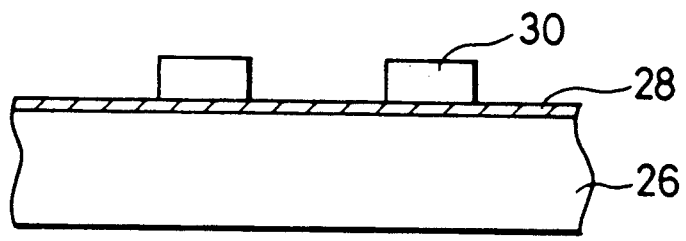
FIG. 1 is an illustration of a process for producing a semiconductor device in Example according to the present invention.
Figure 1B:
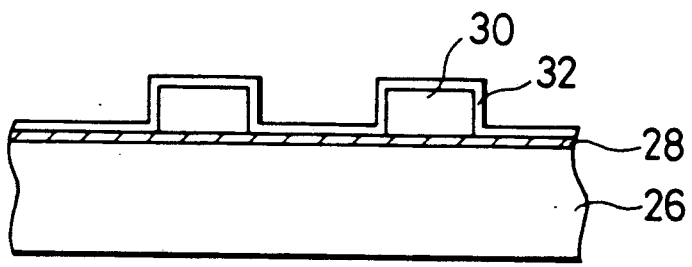
Figure 1C:
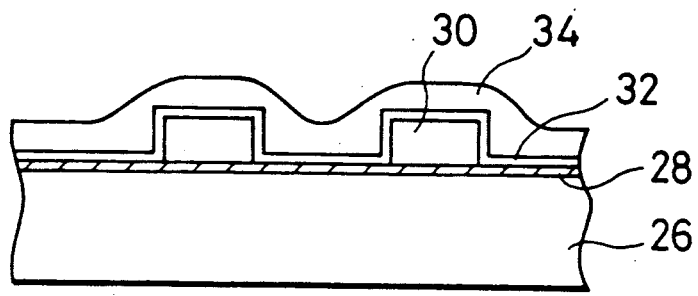
Figure 2:
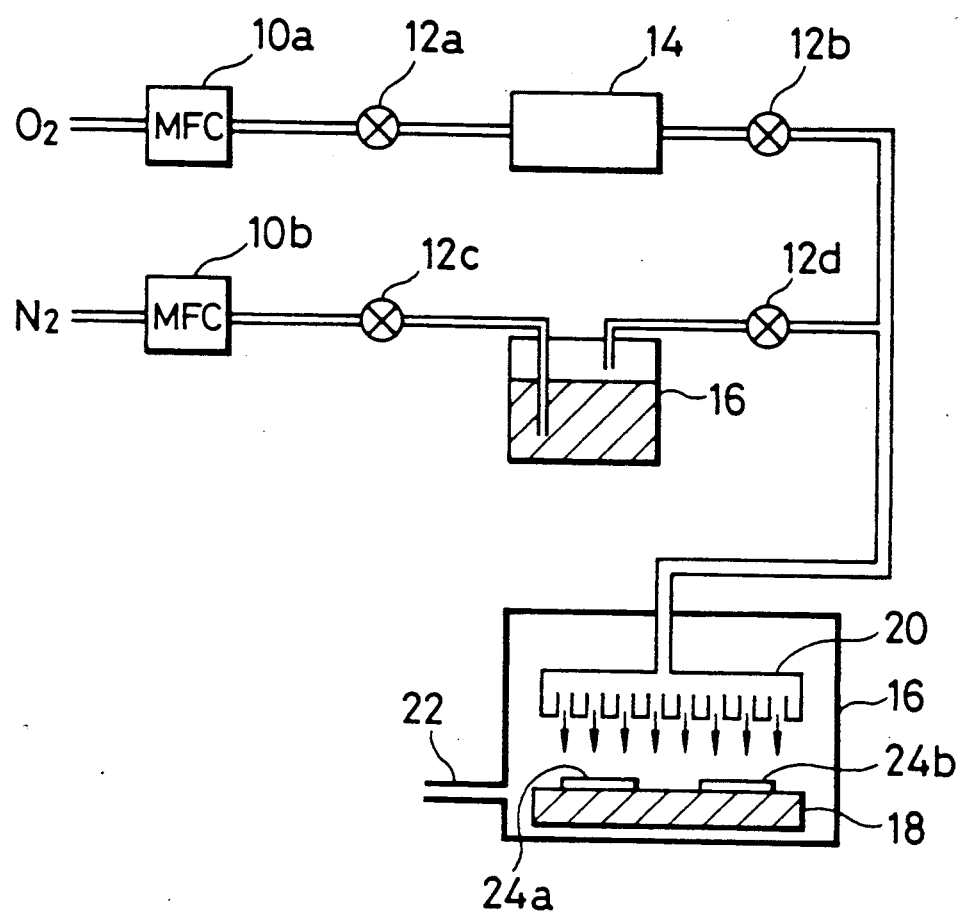
FIG. 2 is a schematic diagram illustrating an example of production equipment for use in the process of the present invention.
Figure 3:
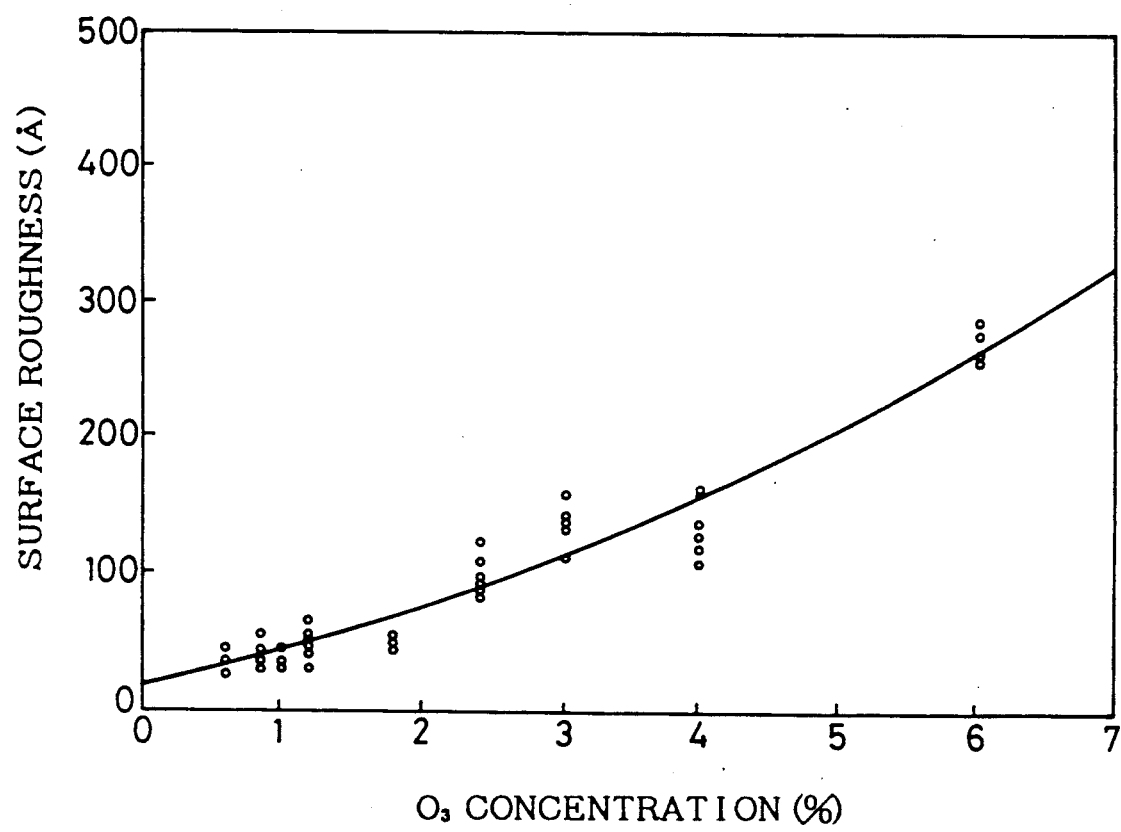
FIG. 3 is a characteristic diagram showing the relationship between the ozone concentration and the surface state of CVD-SiO$_2$ film.

FIG. 1 illustrates a CVD process using the TEOS-$O_3$ reaction in Example according to the present invention, while FIG. 2 illustrates an example of production equipment for use in the CVD process of the present invention.

The equipment of FIG. 2 comprises mass flow controllers (MFC) 10a and 10b, valves 12a to 12d, an ozone generator 14 wherein oxygen ($O_2$) is converted into ozone ($O_3$), a resorvoir 16 for a TEOS solution which is kept at a temperature of 40 to 65° C., and a CVD chamber 16.

The CVD chamber 16 includes a heater 18, a gas outflow head 20, and a gas discharge outlet 22. Wafers 24a and 24b to be subjected to film formation are in place in the chamber 16.

The procedure of CVD-$SiO_2$ film deposition in the equipment of FIG. 2 is as follows. The valves 12a and 12b are opened. This entails generation of $O_3$ gas in the ozone generator 14, from which the $O_3$ gas is fed into the chamber 16 through the gas inflow head 20, through which TEOS gas on a carrier gas $N_2$ is also fed into the chamber 16. The TEOS gas is decomposed with the aid of the $O_3$ gas on the wafers 22a and 22b to deposit CVD-$SiO_2$ films on the surfaces of the wafers 22a and 22b.

The $O_3$ concentration may be changed by controlling the amount of conversion of $O_2$ into $O_3$ in the ozone generator 14, or by appropriately adjusting the mass flow controller (MFC) 10a as well as the valves 12a and 12b.

The process for forming a CVD-$SiO_2$ film in this Example according to the present invention will now be described while referring to FIG. 1.

As shown in FIG. 1 (a), an Si substrate 26 is heat-treated to form a thermal $SiO_2$ film 28 to serve as a gate insulating film, followed by deposition of poly-Si according to a CVD method and subsequent patterning thereof to form a poly-Si film 30 to serve as a gate electrode.

Figure 4A:
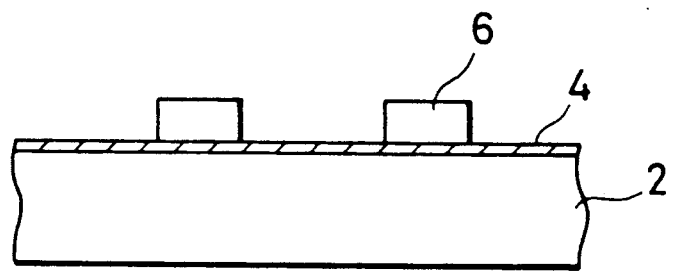
FIG. 4 is an illustration of a conventional process for producing a semiconductor device.
Figure 4B:
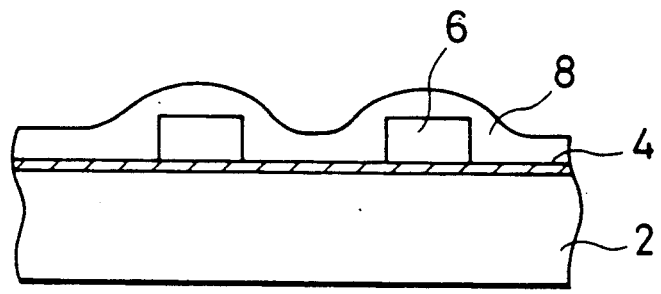
Figure 4C:
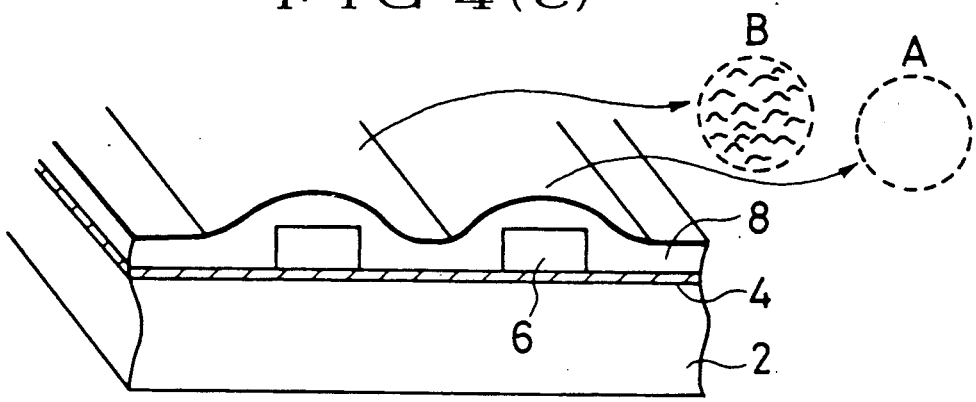

Subsequently, a CVD-$SiO_2$ film is deposited using the equipment of FIG. 2. The substrate temperature is first set at 400° C. with the heater 18. The $O_3$ concentration is initially set to be about 1 mol% to deposit a CVD-$SiO_2$ film 32 as shown in FIG. 4 (b). The thickness of the film 32 may be satisfactory in so far as the thermal $SiO_2$ film 28 can be covered therewith, and is as small as, for example, 1,000 Å.

Subsequently, the $O_3$ concentration is increased to about 5 mol%, at which a CVD-$SiO_2$ film 34 is then deposited as shown in FIG. 4 (c). The thickness of the film 34 is desired to be as large as, for example, about 6,000 Å to be on a level of thickness required of an interlayer insulating film.

Even at such a high $O_3$ concentration, the underlying thermal $SiO_2$ film 28 exerts no substantial influences on the CVD-$SiO_2$ film 34 because it is perfectly covered with the CVD-$SiO_2$ film 32 (formed at the $O_3$ concentration of about 1 mol%). Thus, the surface of the CVD-$SiO_2$ film 34 (formed at the $O_3$ concentration of about 5 mol%) is little uneven.

The CVD-$SiO_2$ film 34 (formed at the $O_3$ concentration of about 5 mol%) shows a deposition form of flowing profiles around angular parts of stepped portions of the poly-Si film 30 with excellent coverage, and is of high quality with reduced moisture absorption.

In this Example according to the present invention, the surface of the CVD-$SiO_2$ film 34 (formed at the $O_3$ concentration of about 5 mol%) can be made even, or smooth, even on the surface areas of the thermal $SiO_2$ film 28, included in the underlying surface, without undergoing any unfavorable influences of the underlying surface, while providing good film quality and coverage characteristics.

As described hereinbefore, according to the process of the present invention, the first stage of covering the underlying surface including the surface areas of the thermal $SiO_2$ film, if any, with a CVD-$SiO_2$ film deposited according to the TEOS-$O_3$ reaction at a low $O_3$ concentration is followed by the second stage of further depositing a CVD-$SiO_2$ film with good film quality and coverage characteristics according to the TEOS-$O_3$ reaction at a high $O_3$ concentration to form an insulating film having a predetermined thickness for the purpose of avoiding the unfavorable influences of the underlying surface. This enables formation of an insulating film with a surface little uneven, endowed with satisfactory characteristics of an $SiO_2$ film formed according to the TEOS-$O_3$ reaction at a high $O_3$ concentration. This enables production of highly reliable semiconductor devices with reduced stress put on wirings and the like formed thereon.

What is claimed is:

1. A process for producing a semiconductor device, comprising depositing a CVD-$SiO_2$ film at a given first $O_3$ concentration according to a TEOS-$O_3$ reaction, and further depositing a CVD-$SiO_2$ film at a second $O_3$ concentration higher than said first $O_3$ concentration according to the TEOS-$O_3$ reaction.

2. A process for producing a semiconductor device as claimed in claim 1, wherein said first $O_3$ concentration is about 0.5 to 2 mol%, while said second $O_3$ concentration is about 4 to 7 mol%.

* * * * *

UNITED STATES PATENT AND TRADEMARK OFFICE
CERTIFICATE OF CORRECTION

PATENT NO. : 5,051,380

DATED : September 24, 1991

INVENTOR(S) : Maeda et al.

It is certified that error appears in the above-identified patent and that said Letters Patent is hereby corrected as shown below:

Title Page   ABSTRACT: Line 3 delete " $TEOS-SiO_3$ " and substitute -- $TEOS-O_3$ --

Signed and Sealed this

Twenty-ninth Day of June, 1993

Attest:

MICHAEL K. KIRK

*Attesting Officer*   Acting Commissioner of Patents and Trademarks